United States Patent
Chiu et al.

(10) Patent No.: US 12,308,269 B2
(45) Date of Patent: May 20, 2025

(54) SUBSTRATE CONTAINER AND ITS DOOR ASSEMBLY, SUPPORT ASSEMBLY, AND ELASTIC BUFFER ELEMENT

(71) Applicant: GUDENG PRECISION INDUSTRIAL CO., LTD., New Taipei (TW)

(72) Inventors: Ming-Chien Chiu, New Taipei (TW); En-Nien Shen, New Taipei (TW); Chia-Ho Chuang, New Taipei (TW); Kuo-Hua Lee, New Taipei (TW); Jyun-Ming Lyu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 2 days.

(21) Appl. No.: 18/344,841

(22) Filed: Jun. 29, 2023

(65) Prior Publication Data

US 2024/0002140 A1    Jan. 4, 2024

Related U.S. Application Data

(60) Provisional application No. 63/357,011, filed on Jun. 30, 2022.

(51) Int. Cl.
| | | |
|---|---|---|
| H01L 21/673 | (2006.01) | |
| B65D 25/10 | (2006.01) | |
| B65D 25/24 | (2006.01) | |
| B65D 85/30 | (2006.01) | |
| B65D 85/38 | (2006.01) | |

(52) U.S. Cl.
CPC ...... *H01L 21/67383* (2013.01); *B65D 25/107* (2013.01); *B65D 25/24* (2013.01); *B65D 85/307* (2013.01); *B65D 85/38* (2013.01)

(58) Field of Classification Search
CPC .... B65D 25/24; B65D 25/107; B65D 81/107; B65D 85/30; B65D 85/38; B65D 85/307; H01L 21/673; H01L 21/67383; H01L 21/67369; H01L 21/67379
USPC .......................... 206/454, 710, 711
See application file for complete search history.

(56) References Cited

U.S. PATENT DOCUMENTS

| | | | |
|---|---|---|---|
| 6,267,245 B1* | 7/2001 | Bores ................. | H01L 21/67383 206/711 |
| 2007/0295638 A1* | 12/2007 | Nakatogawa ..... | H01L 21/67386 206/711 |
| 2014/0197068 A1* | 7/2014 | Cho .................. | H01L 21/67383 206/711 |

(Continued)

Primary Examiner — Luan K Bui

(57) ABSTRACT

A substrate container includes a container body having a storage space and an opening in communication with the storage, a door body disposed at the opening, a limiter disposed on the door body and facing the opening, a supporter disposed on one side of the storage space, and at least two elastic buffer elements tightly disposed between the door body and the limiter and between the supporter and the container body, respectively. A door assembly of a substrate container, a support assembly of a substrate container and an elastic buffer element used in a substrate container are further provided. The elastic buffer element is applied between any two rigid elements in the substrate container to provide a buffer force and an appropriate frictional force, so as to alleviate the problems of impact and dust generated between the rigid elements.

5 Claims, 6 Drawing Sheets

(56) References Cited

U.S. PATENT DOCUMENTS

| | | | |
|---|---|---|---|
| 2015/0083639 A1* | 3/2015 | Gregerson | H01L 21/67369 |
| | | | 206/711 |
| 2017/0294327 A1* | 10/2017 | Gregerson | H01L 21/67386 |
| 2022/0277977 A1* | 9/2022 | Kanai | H01L 21/67383 |
| 2023/0054753 A1* | 2/2023 | Chiu | H01L 21/67366 |

* cited by examiner

SUBSTRATE CONTAINER AND ITS DOOR ASSEMBLY, SUPPORT ASSEMBLY, AND ELASTIC BUFFER ELEMENT

CROSS-REFERENCE TO RELATED APPLICATION

This non-provisional application claims priority under 35 U.S.C. § 119(e) on U.S. provisional Patent Application Nos. 63/357,011 filed on Jun. 30, 2022, the entire contents of which are hereby incorporated by reference.

BACKGROUND OF THE INVENTION

1. Field of the Invention

The present disclosure relates to a container, and in particular to a substrate container comprising a door assembly, a support assembly, and an elastic buffer element.

2. Description of the Related Art

Substrate containers are used to carry substrates in the semiconductor industry. These substrates can be semiconductor elements such as printed circuit boards and wafers, or can be plate-like objects such as trays or glass. Due to overly large vertical vibration during the transportation process of substrates, the substrates are easily broken, or components of a carrier of the substrates may become loosened from one another, or dust is generated due to friction, and the particles inside the substrate container may be severely affected. Moreover, the problem of dust generated during transportation and positioning operations in coordination with an apparatus interface may also be caused.

Therefore, there is a need for a solution for overcoming the numerous problems, including damage to substrates caused by vibration of the substrate container, loosening of assembly components in the substrate container, friction inside the substrate container and between the assembly elements, and the problem of dust generated by friction during transportation and position processes of the substrate container with an apparatus interface.

BRIEF SUMMARY OF THE INVENTION

To overcome the numerous problems of a conventional substrate container, the present disclosure provides a substrate container comprising a door assembly, a support assembly, and an elastic buffer element.

To achieve the above objectives and more, the present disclosure provides a substrate container including a container body, having a storage space and an opening in communication with the storage space; a door body, disposed at the opening; a limiter, disposed on the door body and facing the opening; a supporter, disposed on one side of the storage space; and at least two elastic buffer elements, tightly disposed between the door body and the limiter and between the supporter and the storage space, respectively.

In an embodiment of the present disclosure, each of the at least two elastic buffer elements includes a sleeve, each sleeve has two sleeve abutting surfaces, and the two sleeve abutting surfaces are connected to form a sleeve space and a sleeve opening in communication with the sleeve space.

In an embodiment of the present disclosure, the door body has at least one protrusion on a surface facing the opening, and one of the at least two elastic buffer elements is disposed at the protrusion. The two sleeve abutting surfaces of the elastic buffer element disposed at the protrusion are used for tightly abutting between the door body and the limiter.

In an embodiment of the present disclosure, the supporter has at least one protrusion, the protrusion faces an inner wall surface of the container body, and one of the at least two elastic buffer elements is disposed at the protrusion. The two sleeve abutting surfaces of the elastic buffer element disposed at the protrusion are used for tightly abutting between the supporter and the inner wall surface.

In an embodiment of the present disclosure, at least one air pressure regulator is further included. The at least one air pressure regulator is disposed in at least one through-hole of the door body and is used for regulating an air replacement rate inside the storage space.

In an embodiment of the present disclosure, at least two air pressure regulators are further included. The at least two air pressure regulators are a combination of an inlet air regulating component, an outlet air regulating component or at least one inlet air regulating component and at least one outlet air regulating component. The air inlet regulating component and the air outlet regulating component are disposed in different through-holes of the door body, respectively.

The present disclosure further provides a door assembly of a substrate container, the door assembly comprises a door body, disposed at an opening of the substrate container, the door body provided with at least one protrusion on a surface facing the opening; a limiter, disposed at the door body, the limiter facing the opening; and at least one elastic buffer element, disposed at the protrusion. The elastic buffer element comprises a sleeve, the sleeve having two sleeve abutting surfaces, the two sleeve abutting surfaces connected to form a sleeve space and a sleeve opening in communication with the sleeve space. The protrusion is placed into the sleeve space from the sleeve opening, and the two sleeve abutting surfaces are used for tightly abutting between the door body and the limiter.

In an embodiment of the present disclosure, the sleeve has an enclosed end, and a top end of the protrusion abuts the enclosed end.

The present disclosure further provides a support assembly of a substrate container, the support assembly comprises a supporter, disposed on one side of a storage space of the substrate container, the supporter having at least one protrusion, the protrusion facing an inner wall surface of the substrate container; and at least one elastic buffer element, disposed at the protrusion, the elastic buffer element comprises a sleeve, the sleeve having two sleeve abutting surfaces, the two sleeve abutting surfaces connected to form a sleeve space and a sleeve opening in communication with the sleeve space. The protrusion is placed into the sleeve space from the sleeve opening, and the two sleeve abutting surfaces are used for tightly abutting between the supporter and the inner wall surface.

In an embodiment of the present disclosure, the sleeve further has an exit opening. The exit opening is in communication with the sleeve space, and the protrusion exits the exit opening from the sleeve space.

In an embodiment of the present disclosure, the protrusion further has an engaging end on one end. The engaging end exits the exit opening and engages at an outer surface of the sleeve.

The present disclosure further provides an elastic buffer element used in a substrate container. The substrate container is provided with a first part and a second part, wherein the first part has a protrusion. The elastic buffer element includes a sleeve, which is sleeved at the protrusion and is used for tightly abutting between the first part and the second part.

In an embodiment of the present disclosure, the first part is a door body and the second part is a limiter. The sleeve is sleeved at the protrusion of the door body, and is used for tightly abutting between the door body and the limiter.

In an embodiment of the present disclosure, the sleeve has an enclosed end, and a top end of the protrusion abuts the enclosed end.

In an embodiment of the present disclosure, the first part is a supporter and the second part is an inner wall surface of the substrate container. The sleeve is sleeved at the protrusion of the supporter and is used for tightly abutting between the supporter and the inner wall surface.

In an embodiment of the present disclosure, the sleeve has a sleeve space, a sleeve opening and an exit opening. The sleeve opening and the exit opening are in communication with the sleeve space, and the protrusion is placed into the sleeve space from the sleeve opening and exits the exit opening from the sleeve space.

In conclusion, the substrate container, the door assembly, the support assembly, and the elastic buffer element thereof of the present disclosure, by using the elastic buffer element applied between any two rigid elements in the substrate container, provide a buffer force and an appropriate frictional force, so as to alleviate the problems of impact and dust generated between the rigid elements. Moreover, if deformation of the substrate container is caused due to thermal expansion and contraction, the deformation can be eliminated with the elastic buffer element provided, further preventing loosening between components.

DETAILED DESCRIPTION OF THE INVENTION

To fully understand the present disclosure, the present disclosure is described in detail by way of specific embodiments with the accompanying drawings below. A person skilled in the art would be able to understand the objects, features and effects of the present disclosure based the disclosure of the present application. It should be noted that the present disclosure may be implemented or applied by other specific embodiments, and changes and modifications may also be made based on different perspectives and applications to various details in the description without departing from the spirit of the present disclosure. Technical contents associated with the present disclosure are described in detail below, and it should be noted that the disclosure is not to be construed as limitations to the scope of claims of the present disclosure. Associated details are given in the description below.

Figure 1:
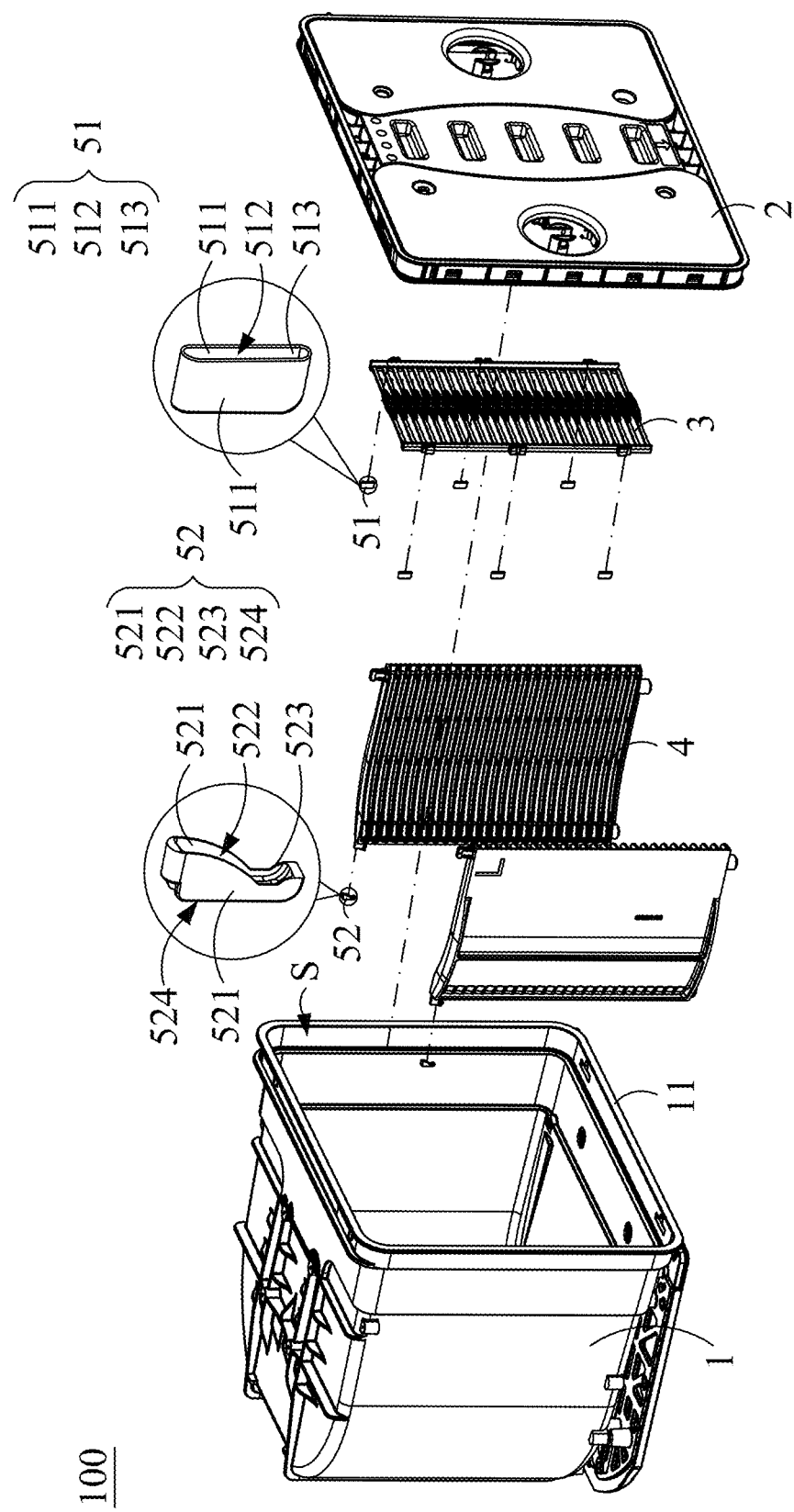
FIG. 1 is an assembly schematic diagram of a substrate container according to an embodiment of the present disclosure.

As shown in FIG. 1, a substrate container 100 according to an embodiment of the present disclosure includes a container body 1, a door body 2, a limiter 3, a supporter 4, and at least two elastic buffer elements 51 and 52.

The container body 1 has a storage space S and an opening 11 in communication with the storage space S. The storage space S is used for accommodating, for example, but not limited to a plurality of plate-like objects, such as circuit boards, wafers, trays, and glass.

The door body 2 is movably disposed at the opening 11, and is used for closing or opening the storage space S.

Figure 2:
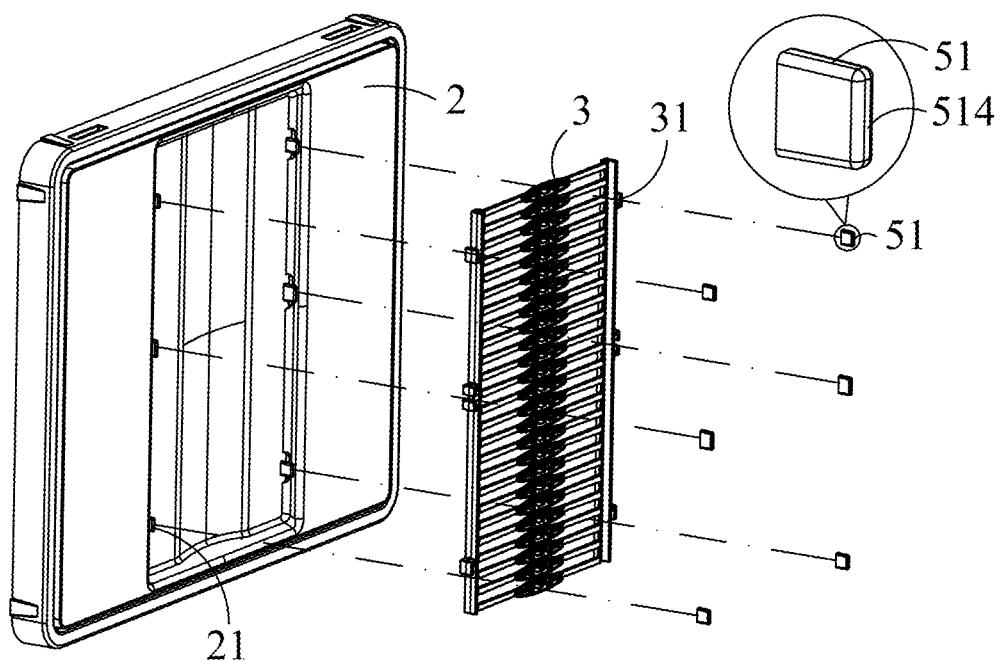
FIG. 2 is an assembly schematic diagram of a door assembly according to an embodiment of the present disclosure.
Figure 3:
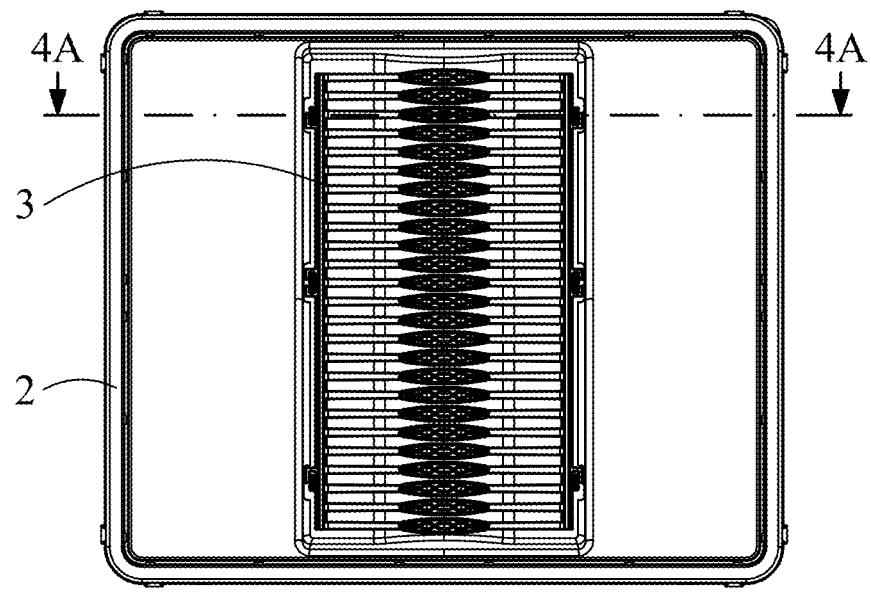
FIG. 3 is a rear view of a door assembly according to an embodiment of the present disclosure.
Figure 4A:
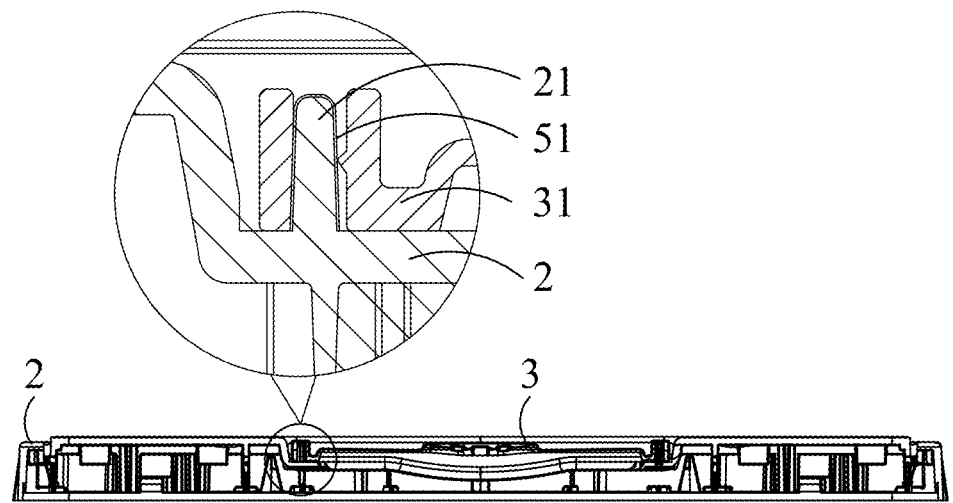
FIG. 4A is a cross-sectional schematic diagram along the line 4A-4A in FIG. 3.
Figure 4B:
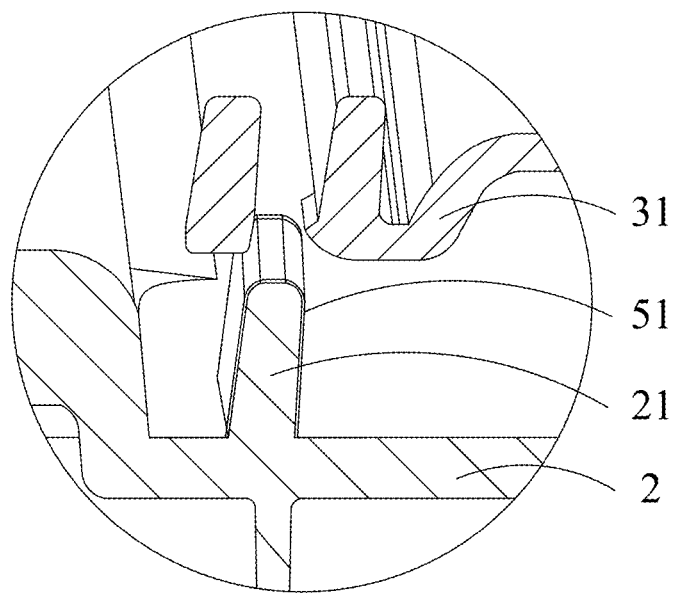
FIG. 4B is a cross-sectional assembly schematic diagram of a limiter and an elastic buffer element not yet fitted with each other.

As shown in FIG. 2 and FIG. 3 and continue to refer to FIG. 1, the door body 2 is provided with at least one protrusion 21 on a surface facing the opening 11, the limiter 3 is disposed on the protrusion 21 of the door body 2, and the limiter 3 faces the opening 11 and is used for holding a plurality of plate-like objects in the storage space S to provide a more stable support effect.

Figure 5A:
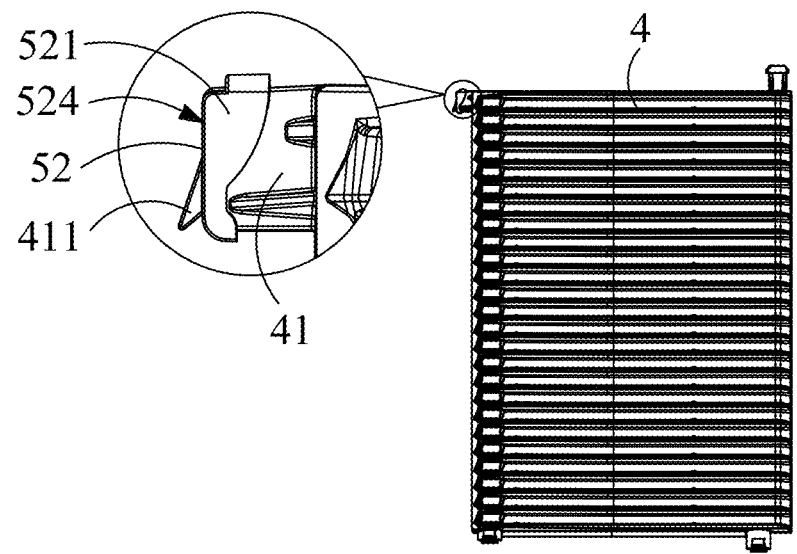
FIG. 5A is a side view of a support assembly according to an embodiment of the present disclosure.
Figure 5B:
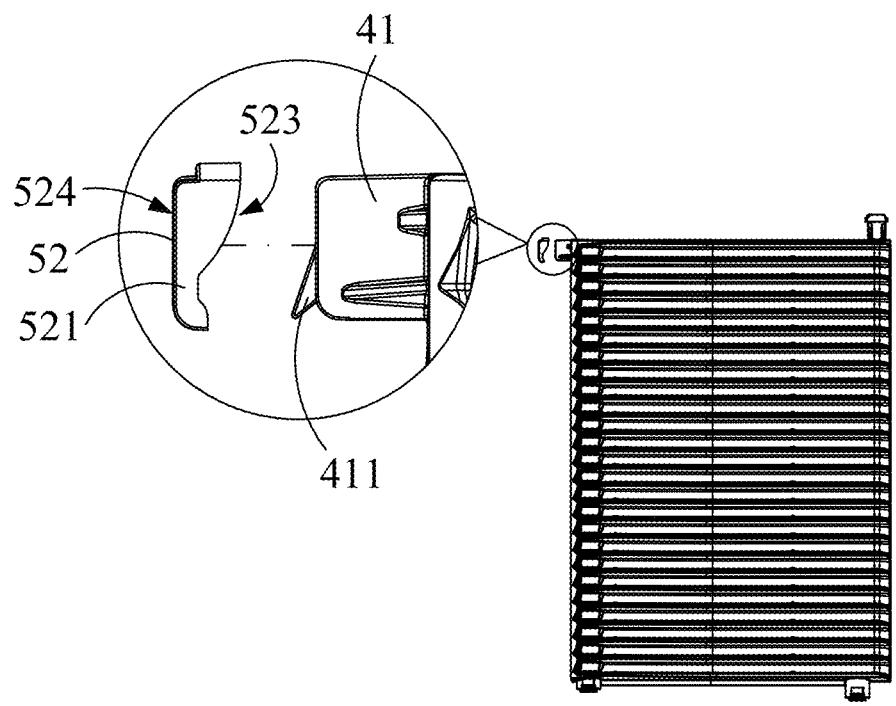
FIG. 5B is an enlarged diagram of an engaging end and an elastic buffer element before engagement with each other according to an embodiment of the present disclosure.
Figure 5C:
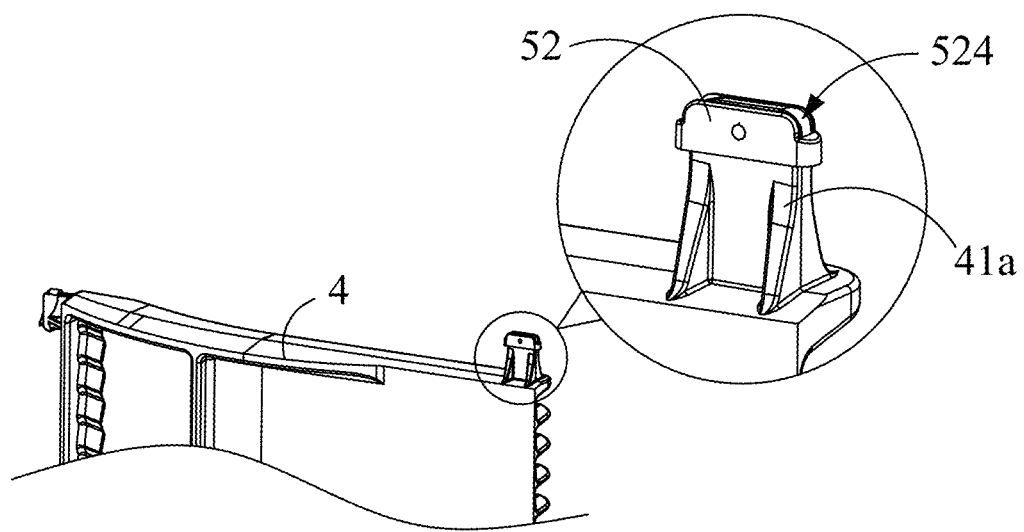
FIG. 5C is an enlarged partial schematic diagram of a variation example of a support assembly according to an embodiment of the present disclosure.
Figure 6A:
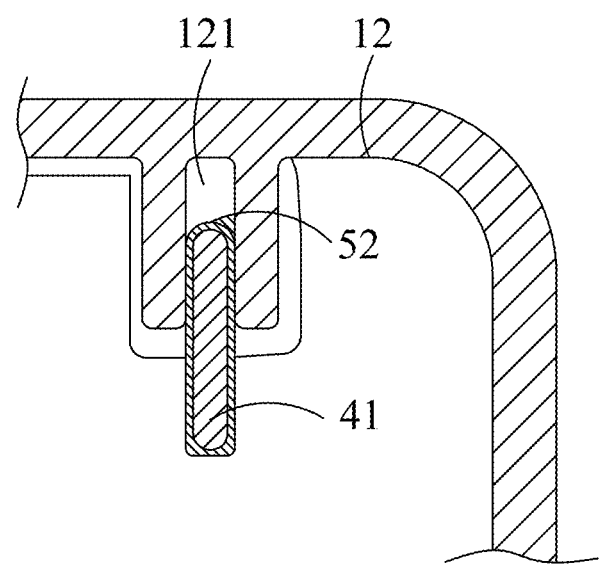
FIG. 6A is a first cross-sectional diagram of an elastic buffer element applied to a substrate container according to an embodiment of the present disclosure.
Figure 6B:
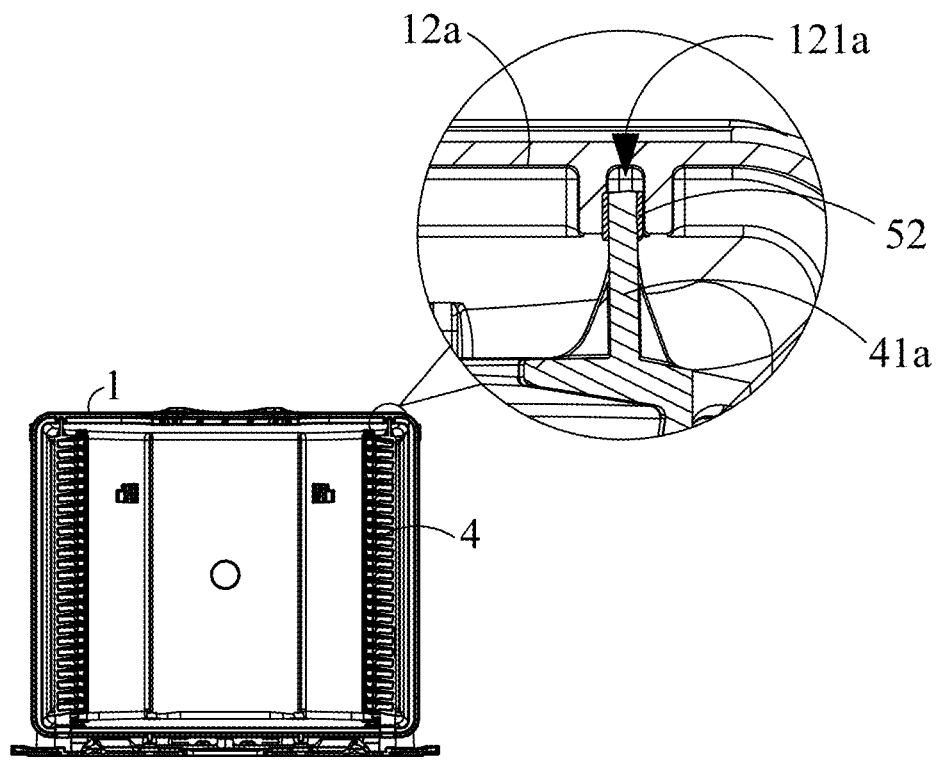
FIG. 6B is a second cross-sectional diagram of an elastic buffer element applied to a substrate container according to an embodiment of the present disclosure.

The supporter 4 is disposed on one side of the storage space S, and is used for supporting and/or separating the plurality of plate-like objects in the storage space S. The supporter 4 is preferably provided as two in quantity, which are respectively disposed on two opposite sides of the storage space S. As shown in FIG. 5A and FIG. 6A, the supporter 4 has at least one protrusion 41, and the protrusion 41 faces an inner wall surface 12 of the container body 1. The inner wall surface 12 may be a left or right wall surface, a rear wall surface, a bottom wall surface, or a top wall surface of the container body 1. The present disclosure does not define the actual position of the inner wall surface 12, and any inner wall surface of the container body 1 mutually fitted with the supporter 4 can be the inner wall surface 12 of the present disclosure. In FIG. 6A, the inner wall surface 12 is the rear wall surface of the container body 1. In another example, as shown in FIG. 6B, an inner wall surface 12a is the top wall surface of the container body 1.

As shown in FIG. 1 to FIG. 6B, the at least two elastic buffer elements 51 and 52 are respectively disposed between the door body 2 and the limiter 3 and between the supporter 4 and the container body 1. The elastic buffer element 51 is disposed between the door body 2 and the limiter 3 and the elastic buffer element 52 is disposed between the supporter 4 and the container body 1. The elastic buffer elements 51 and 52 are made of an elastic and abrasion-resistant material such as silicone gel or fluoroelastomer and are capable of solving the problems of disengagement due to vibration or thermal expansion and contraction caused by mutual packing and interference between the existing limiter and door body, as well as solving the problems of interfering friction caused by rigidity between the existing support and container body and impact due to the gap between the two that lead to the issue of dust generated.

With the elastic and abrasion-resistant properties of the elastic buffer elements 51 and 52, when the elastic buffer element 51 is sleeved at the door body 2, deformation of the elastic buffer element 51 is generated due to being pressed by a connecting portion 31 of the limiter 3, accordingly achieving effects of tight abutment. More specifically, the elastic buffer element 51 is pressed tightly between the connecting portion 31 of the limiter 3 and a protrusion 21 of the door body 2, and the material properties of the elastic buffer element 51 produce a high-level pressing force and provide a buffer force and an appropriate frictional force. In addition, if deformation of the substrate container 100 is generated due to thermal expansion and contraction, the deformation can be eliminated by the provided elastic buffer element 51, further preventing the limiter 3 from loosening from the door body 2. On the other hand, when the elastic buffer element 52 is sleeved at the supporter 4 and the supporter 4 is assembled to a fastening slot 121 (referring to FIG. 6A) of the inner wall surface 12 of the container body 1, the elastic buffer element 52 can fill the gap between the protrusion 41 of the supporter 4 and the fastening slot 121 at this point, accordingly solving the problem of the dust generated by friction.

The description is given by taking the door body 2 and the limiter 3, and the supporter 4 and the container body 1. As an example of an embodiment, it is to be noted that the elastic buffer elements of the present disclosure are applied between any two rigid elements in the substrate container 100 to provide a buffer force and an appropriate frictional force, so as to alleviate the problems of impact and dust generated between the rigid elements. Therefore, the elastic buffer elements of the present disclosure are not limited to being disposed between the door body 2 and the limiter 3 or between the supporter 4 and the container body 1. According to the design requirements of the container body 1, any two adjacent parts may be regarded as a first part and a second part, wherein the first part has a protrusion, and the elastic buffer element is held between the first part and the second part. For example, the first part is the door body 2 or the supporter 4, and the second part is the limiter 3 or the container body 1.

The elastic buffer element of the present disclosure is structured to include a sleeve, which is sleeved at the protrusion of the first part and is used for tightly abutting between the first part and the second part.

Referring to FIG. 1 to FIG. 4B, the elastic buffer element 51 is disposed between the door body 2 and the limiter 3 as an example for illustration purposes. The sleeve 51 has two sleeve abutting surfaces 511, the two sleeve abutting surfaces 511 are connected to form a sleeve space 512 and a sleeve opening 513 in communication with the sleeve space 512. The sleeve opening 513 allows the protrusion 21 of the door body 2 (first part) to be placed into the sleeve space 512 via the sleeve opening 513, thereby allowing the sleeve to be sleeved on the protrusion 21 of the door body 2. The two sleeve abutting surfaces 511 of the sleeve are used for tightly abutting between the door body 2 and the limiter 3 (second part). More specifically, the inner surface of the sleeve abutting surface 511 is located close to a side surface of the protrusion 21 and is tightly abutted against the door body 2. The outer surface of the sleeve abutting surface 511 is located close to the limiter 3 and is tightly abutted against the limiter 3. The sleeve has two sleeve abutting surfaces 511, and each of the sleeve abutting surfaces 511 is closely abutted between the protrusion 21 and the limiter 3. In the present disclosure, the material property of elastic deformation of the elastic buffer element 51 is used to generate a high-level pressing force between the door body 2 and the limiter 3, and a buffer force and an appropriate frictional force are provided to further prevent the limiter 3 from loosening from the door body 2. In this example, the sleeve further has an enclosed end 514, and a top end of the protrusion 21 of the door body 2 abuts against the enclosed end 514. That is to say, the sleeve envelops the protrusion 21 in a closed manner.

In another example, referring to FIG. 1 and FIG. 5A to FIG. 6A, taking the elastic buffer element 52 disposed between the supporter 4 and the container body 1. As an example, the sleeve thereof has two sleeve abutting surfaces 521, the two sleeve abutting surfaces 521 are connected to form a sleeve space 522 and a sleeve opening 523 in communication with the sleeve space 522. The sleeve opening 523 allows the protrusion 41 of the supporter 4 (first part) to be placed into the sleeve space 522 via the sleeve opening 523, thereby allowing the sleeve to be sleeved on the protrusion 41 of the supporter 4. The two sleeve abutting surface 521 are used for tightly abutting between the supporter 4 and the inner wall surface 12 of the container body 1 (second part). More specifically, the inner surface of the sleeve abutting surface 521 is located close to a side surface of the protrusion 41 and is tightly abutted against the supporter 4. The outer surface of the sleeve abutting surface 521 is located close to the inner wall surface 12 and is tightly abutted against the inner wall surface 12. The sleeve has two sleeve abutting surfaces 521, and each of the sleeve abutting surfaces 521 is closely abutted between the protrusion 41 and the inner wall surface 12. In the present disclosure, the material property of elastic deformation of the elastic buffer element 52 is used to generate a high-level pressing force between the inner wall surface 12 and the supporter 4, and a buffer force and an appropriate frictional force are provided to further prevent the supporter 4 from loosening from the container body 1, and to at the same time prevent the problem of dust generated by friction. In this example, the sleeve further has an exit opening 524. The exit opening 524 is in communication with the sleeve space 522, and the protrusion 41 of the supporter 4 exits the exit opening 524 from the sleeve space 522. Further, in this example, as shown in FIG. 5A and FIG. 5B, the protrusion 41 of the supporter 4 further has an engaging end 411 on an end, the exit opening 524 matches with the position of the engaging end 411, and the engaging end 411 exits the exit opening 524 and engages at an outer surface of the sleeve, accordingly engaging and fixing the elastic buffer element 52. In other variation examples, as shown in FIG. 5C, a protrusion 41a of the supporter 4 may exclude the engaging end 411, the elastic buffer element 52 is still sleeved at the protrusion 41a of the supporter 4, and the protrusion 41a exits the exit opening 524. For example, when the protrusion 41a of the supporter 4 faces the top wall surface of the container body 1, the elastic buffer element 52 can be naturally sleeved at the protrusion 41a by using gravitational force, and the protrusion 41a is not required to have the engaging end 411. However, the present disclosure is not limited to the examples above.

In a corresponding variation example of FIG. 6A, an inner wall surface 12a of FIG. 6B serves as a top wall surface of the container body 1, as compared to the inner surface 12 of FIG. 6A that serves as a rear wall surface of the container body 1. In this example, the elastic buffer element 52 between the supporter 4 and the container body 1 allows the protrusion 41a at the top end of the supporter 4 to be placed in, such that the sleeve is sleeved at the protrusion 41a of the supporter 4 to allow the elastic buffer element 52 to be tightly abutted between the supporter 4 and a fastening slot 121a of the inner wall surface 12a. The material property of elastic deformation of the elastic buffer element 52 is used to generate a high-level pressing force between the inner wall surface 12a and the supporter 4, and a buffer force and an appropriate frictional force are provided to further prevent the supporter 4 from loosening from the container body 1, and at the same time prevent the problem of dust generated by friction.

Figure 7:
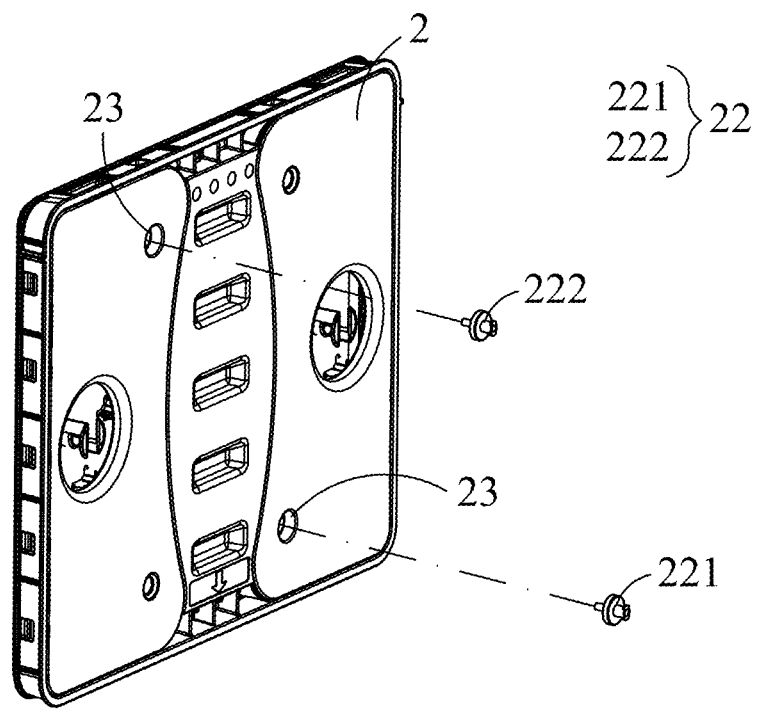
FIG. 7 is a schematic diagram of an assembly of an air pressure regulator according to an embodiment of the present disclosure.

Further, in an embodiment, referring to FIG. 1 and FIG. 7, the substrate container 100 further includes at least one air pressure regulator 22 disposed in at least one through-hole 23 of the door body 2. The through-hole 23 may be a hole in communication with the storage space S and the exterior, and an arrangement position thereof is avoided from an arrangement range of the limiter 3. The air pressure regulator 22 is used for regulating an air replacement rate inside the storage space S. The air pressure regulator 22 is, for example, a check valve, and is capable of regulating a pressure value of the storage space S. For example, the air pressure regulator 22 relieves the pressure when the pressure value of the storage space S approximates vacuum, so as to regulate the air replacement in the storage space S and to at the same time effectively reduce the humidity of the storage space S.

Further, the air pressure regulator 22 is provided as two in quantity, and the at least two air pressure regulators 22 are a combination of an inlet air regulating component 221, an outlet air regulating component 222 or at least one inlet air regulating component 221 and at least one outlet air regulating component 222. The air inlet regulating component 221 and the outlet air regulating component 222 are disposed in different through-holes 23 of the door body 2, respectively, so as to enhance the air replacement rate of the storage space S. The inlet air regulating component 221 and the outlet air regulating component 222 are, for example, check valves in opposite directions from each other.

The present invention is described by way of the embodiments above. A person skilled in the art should understand that these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A substrate container, comprising:
    a container body, having a storage space and an opening in communication with the storage space;
    a door body, disposed at the opening;
    a limiter, disposed on the door body and facing the opening;
    a supporter, disposed on one side of the storage space; and
    at least two elastic buffer elements, tightly disposed between the door body and the limiter and between the supporter and the container body, respectively,
    wherein each of the at least two elastic buffer elements comprises a sleeve, each sleeve has two sleeve abutting surfaces, and the two sleeve abutting surfaces are connected to form a sleeve space and a sleeve opening in communication with the sleeve space.

2. The substrate container according to claim 1, wherein the door body is provided with at least one protrusion on a surface facing the opening, one of the at least two elastic buffer elements is disposed at the protrusion, and the two sleeve abutting surfaces of the elastic buffer element disposed at the protrusion are used for tightly abutting between the door body and the limiter.

3. The substrate container according to claim 1, wherein the supporter has at least one protrusion, the protrusion faces an inner wall surface of the container body, one of the at least two elastic buffer elements is disposed at the protrusion, and the two sleeve abutting surfaces of the elastic buffer element disposed at the protrusion are used for tightly abutting between the supporter and the inner wall surface.

4. The substrate container according to claim 1, further comprising at least one air pressure regulator disposed in at least one through-hole of the door body, wherein the at least one air pressure regulator is used for regulating an air replacement rate inside the storage space.

5. The substrate container according to claim 1, further comprising at least two air pressure regulators, wherein the at least two air pressure regulators are a combination of an inlet air regulating component, an outlet air regulating component, or at least one inlet air regulating component and at least one outlet air regulating component, and the air inlet regulating component and the air outlet regulating component are disposed in different through-holes of the door body, respectively.

* * * * *